United States Patent
Lowney et al.

(10) Patent No.: US 9,312,586 B2
(45) Date of Patent: Apr. 12, 2016

(54) SYSTEM AND METHOD FOR REDUCING EFFECTS OF SWITCHED CAPACITOR KICKBACK NOISE

(71) Applicant: Xilinx, Inc., San Jose, CA (US)

(72) Inventors: Donnacha Lowney, Dublin (IE); Edward Cullen, Clane (IE)

(73) Assignee: XILINX, INC., San Jose, CA (US)

( * ) Notice: Subject to any disclaimer, the term of this patent is extended or adjusted under 35 U.S.C. 154(b) by 621 days.

(21) Appl. No.: 13/675,780

(22) Filed: Nov. 13, 2012

(65) Prior Publication Data
US 2014/0132369 A1    May 15, 2014

(51) Int. Cl.
| | |
|---|---|
| *H03H 7/38* | (2006.01) |
| *H01P 1/20* | (2006.01) |
| *H04B 3/20* | (2006.01) |
| *G11C 27/02* | (2006.01) |
| *H03H 7/01* | (2006.01) |

(52) U.S. Cl.
CPC ............... *H01P 1/20* (2013.01); *G11C 27/024* (2013.01); *H03H 7/0123* (2013.01); *H03H 7/38* (2013.01); *H04B 3/20* (2013.01); *H03H 2007/013* (2013.01)

(58) Field of Classification Search
CPC ..................................................... H03H 7/0123
USPC ........................................ 324/95, 111; 333/35
See application file for complete search history.

(56) References Cited

U.S. PATENT DOCUMENTS

| | | | |
|---|---|---|---|
| 5,202,651 A | 4/1993 | Yoshimasu | |
| 8,018,290 B2 * | 9/2011 | Mizutani et al. | ............ 331/60 |
| 2011/0081873 A1 | 4/2011 | Akasegawa | |
| 2012/0176205 A1 * | 7/2012 | Furuta et al. | ............ 333/17.3 |

FOREIGN PATENT DOCUMENTS

| | | |
|---|---|---|
| EP | 0803979 A2 | 10/1997 |
| FR | 2916915 A1 | 12/1993 |

OTHER PUBLICATIONS

Mohan, P.V.A., et al., "Switched Capacitor Filters—Theory, Analysis and Design", Jan. 1, 1995, pp. 7-8, Prentice Hall.
Wong, J.C.W., "CMOS Sample-and-Hold Circuits—ECE 1352 Reading Assignment", Nov. 12, 2001, URL:http://www.eecg.toronto.edu/~kphang/papers/2001/jwong_SH.pdf., pp. 1-15.

* cited by examiner

*Primary Examiner* — Stephen E Jones
(74) *Attorney, Agent, or Firm* — Gerald Chan

(57) ABSTRACT

A circuit includes a first input terminal, a first transmission line, a first sampling switch coupled to the first input terminal through the first transmission line, a first sampling capacitor coupled to the sampling switch, and a first open-circuit quarter wavelength stub coupled to the first transmission line, the first open-circuit quarter wavelength stub configured to reduce kickback noise on the first transmission line. A method for reducing kickback noise in a circuit includes determining a frequency associated with a kickback noise on a first transmission line of the circuit, the circuit having an input terminal coupled to the first transmission line, configuring a length of an open-circuit quarter wavelength stub to correspond to the determined frequency, and coupling the open-circuit quarter wavelength stub to the first transmission line to filter the frequency associated with the kickback noise.

18 Claims, 8 Drawing Sheets

SYSTEM AND METHOD FOR REDUCING EFFECTS OF SWITCHED CAPACITOR KICKBACK NOISE

FIELD OF THE APPLICATION

An embodiment described herein relates to reducing the effects of kickback noise in a switched capacitor network.

BACKGROUND

Switched capacitor networks are used in a wide range of sampling applications, such as in integrators or analog-to-digital converters (ADC). In some cases, a switch is closed to allow an input signal to charge a sampling capacitor. The switch is then opened, disconnecting the sampling capacitor from the input signal. The charge on the capacitor is preserved, which can then be used for further applications such as digitization or integration. However, switched capacitor networks can be affected by parasitic capacitance associated with the switch network. This parasitic capacitance can build up charge at the same time as the sampling capacitor, and then discharge that charge back into the input network when the sampling switch is opened. This may create undesirable memory effects that can persist into subsequent sampling instances.

SUMMARY

In accordance with some embodiments, a circuit includes a first input terminal, a first transmission line, a first sampling switch coupled to the first input terminal through the first transmission line, a first sampling capacitor coupled to the sampling switch, and a first open-circuit quarter wavelength stub coupled to the first transmission line, the first open-circuit quarter wavelength stub configured to reduce kickback noise on the first transmission line.

In accordance with other embodiments, a method for reducing kickback noise in a circuit includes determining a frequency associated with a kickback noise on a first transmission line of the circuit, the circuit having an input terminal coupled to the first transmission line, configuring a length of an open-circuit quarter wavelength stub to correspond to the determined frequency, and coupling the open-circuit quarter wavelength stub to the first transmission line to filter the frequency associated with the kickback noise.

Other and further aspects and features will be evident from reading the following detailed description of the embodiments.

BRIEF DESCRIPTION OF THE DRAWINGS

The drawings illustrate the design and utility of embodiments, in which similar elements are referred to by common reference numerals. These drawings are not necessarily drawn to scale. In order to better appreciate how the above-recited and other advantages and objects are obtained, a more particular description of the embodiments will be rendered which are illustrated in the accompanying drawings. These drawings depict only exemplary embodiments and are not therefore to be considered limiting of the scope of the claims.

FIGS. 2-1 and 2-2 depict an operation of the circuit of FIG. 1;

DETAILED DESCRIPTION

Figure 1:
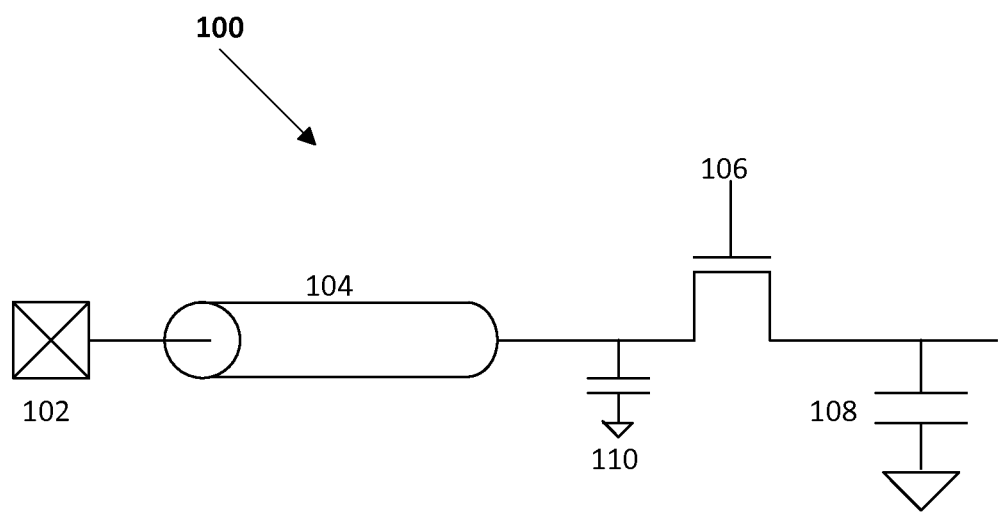
FIG. 1 is a circuit for a switch network.

Various embodiments are described hereinafter with reference to the figures. It should be noted that the figures are not drawn to scale and that the elements of similar structures or functions are represented by like reference numerals throughout the figures. It should be noted that the figures are only intended to facilitate the description of the embodiments. They are not intended as an exhaustive description of the invention or as a limitation on the scope of the claimed invention. In addition, an illustrated embodiment need not have all the aspects or advantages shown. An aspect or an advantage described in conjunction with a particular embodiment is not necessarily limited to that embodiment and can be practiced in any other embodiments, even if not so illustrated, or if not explicitly described. Also, reference throughout this specification to "some embodiments" or "other embodiments" means that a particular feature, structure, material, or characteristic described in connection with the embodiments is included in at least one embodiment. Thus, the appearances of the phrase "in some embodiments" or "in other embodiments" in various places throughout this specification are not necessarily referring to the same embodiment or embodiments Switched capacitor networks may be used to sample analog input signals for a variety of purposes, such as analog-to-digital conversion. FIG. 1 illustrates a circuit 100 for a switch network (e.g., a switched capacitor network). The circuit 100 has a single-arm configuration, but may have other configurations in other embodiments. The circuit 100 includes an input terminal 102, a transmission line 104 coupled to the input terminal 102, a sampling switch 106, and a sampling capacitor 108. The input terminal 102, which may be a contact or a package pin, is configured to receive an input signal. In some embodiments, the input terminal 102 may be a part of a circuit, such as a printed circuit board (PCB). In some embodiments, the sampling switch 106 may be a MOSFET, such as an NMOS, operated by a control signal on its gate. In other embodiments, the sampling switch 106 may be a PMOS or any of other types of transmission gates. As shown in the figure, the sampling switch 106 and the input terminal 102 are connected by a transmission line 104. In the figure, part of the transmission line 104 is illustrated as a cylinder, but it should be understood that the transmission line 104 is not just the cylinder portion, and actually extends from the input terminal 102 to at least the sampling switch 106. Also, the transmission line 104 is not limited to having a circular cross section, and may have other cross sectional shapes in different embodiments. The sampling switch 106 and the sampling capacitor 108 are parts of a sampling network. As shown in the figure, elements of the switch network may contain associated parasitic capacitance, represented by item 110.

Figures 1, 2:
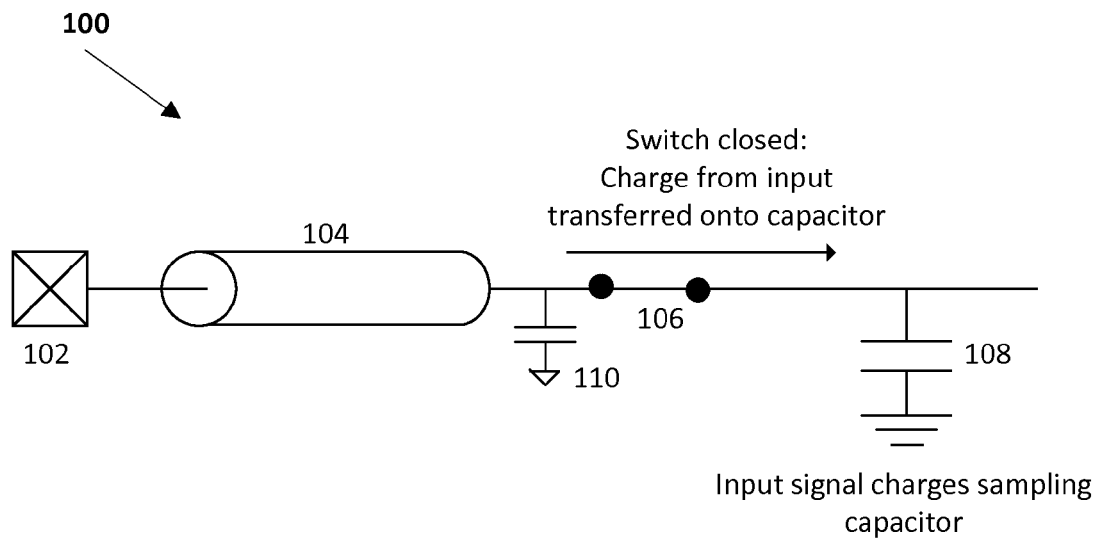
Figure 2:
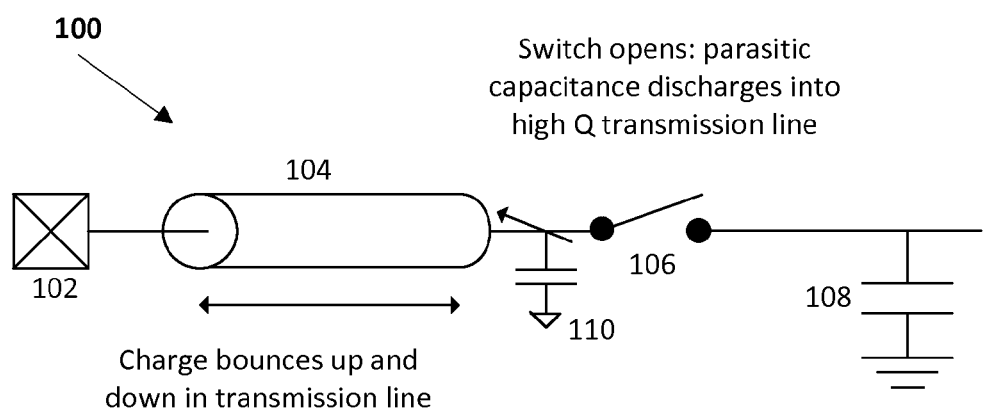

FIGS. 2-1 and 2-2 illustrate an operation of the circuit 100 shown in FIG. 1. As shown in FIG. 2-1, when the sampling switch 106 is closed, charge from the input signal is transferred onto the sampling capacitor 108. As shown in FIG. 2-2, when the sampling switch 106 is open, the accumulated charge on the sampling capacitor 108 is stored and preserved for further use, for example for digitization as part of an ADC.

However, the parasitic capacitance 110 associated with elements of the switch network may produce undesirable operation effects. In particular, when the sampling switch 106 is closed, charge is also stored on the parasitic elements 110 of the circuit 100, as shown in FIG. 2-1, in addition to being stored on the sampling capacitor 108. When the sampling switch 106 is open, the stored parasitic charge is discharged through the transmission line 104 as shown in FIG. 2-2. This discharged charge is a "kickback noise" on the transmission line 104. The transmission line 104 has a resonant tank with a high Q value for the kickback noise, causing it to oscillate within the input network. Because of the oscillation, the kickback noise can persist in the input network until the next sampling instant, creating an undesirable memory effect in the next sample, and degrading the linearity of the system. Therefore it is beneficial to reduce this kickback noise and its effect on the subsequent sampling instant.

Figure 3:
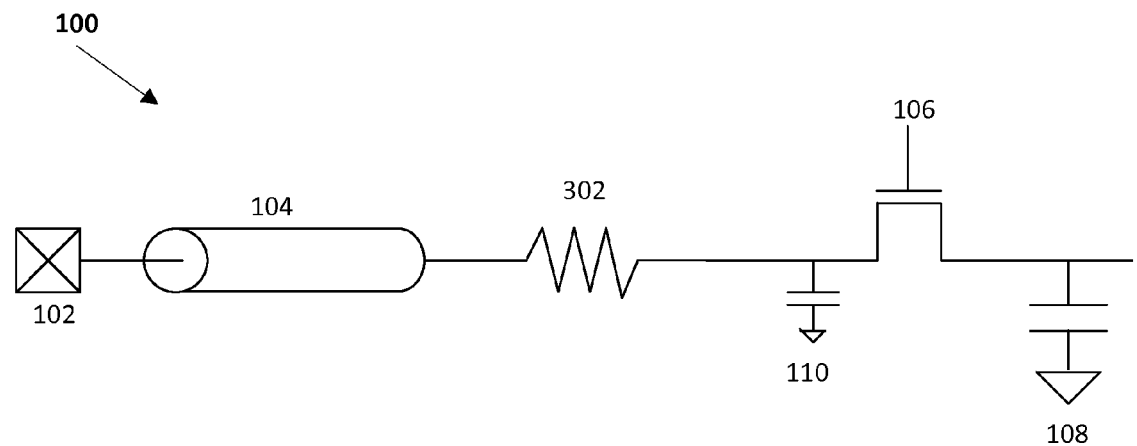
FIG. 3 shows a circuit for a switch network with a series resistor.

FIG. 3 illustrates an approach for mitigating the effects of kickback noise. FIG. 3 shows a circuit 100 for a switch network (e.g., a switched capacitor network). The circuit 100 of FIG. 3 is the same as the circuit 100 of FIG. 1, except that the circuit 100 of FIG. 3 includes a resistor 302 coupled in series between the transmission line 104 and the sampling switch 106. The resistor 302 functions by reducing the Q value of the transmission line 104, dampening the oscillation of the kickback noise. However, the series resistor 302 may have an undesired effect of degrading the input signal during sampling, as the input signal is attenuated through the resistor 302.

Figure 4:
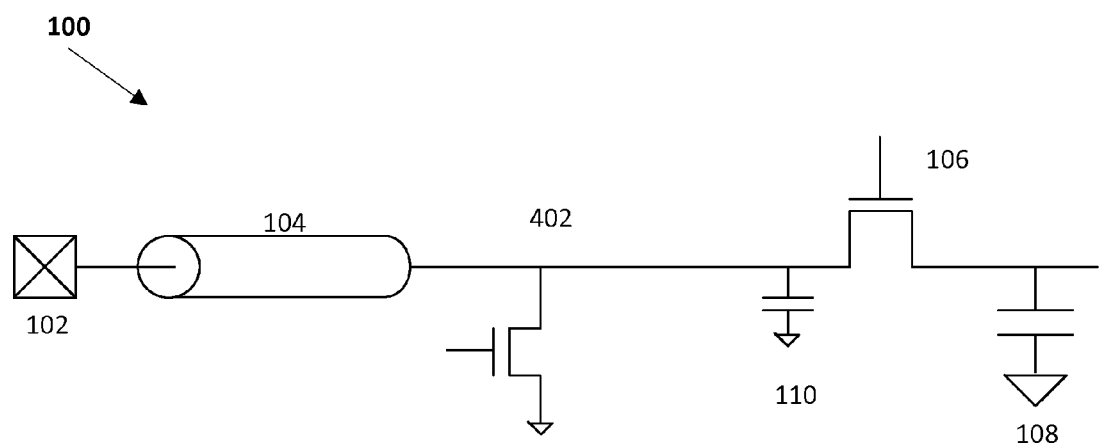
FIG. 4 shows a circuit for a switch network with a hard reset switch.

FIG. 4 illustrates another approach for mitigating the effects of kickback noise. FIG. 4 shows a circuit 100 for a switch network (e.g., a switched capacitor network). The circuit 100 of FIG. 4 is the same as the circuit 100 of FIG. 1, except that the circuit 100 of FIG. 4 includes a reset switch 402 coupled between the transmission line 104 and the sampling switch 106. In some embodiments, the reset switch 402 may be a MOSFET switch. The reset switch 402 is configured to be in opposite state from that of the sampling switch 106. When the sampling switch 106 is closed, the reset switch 402 is open, and has no effect on the input circuit. When the sampling switch 106 opens, the reset switch 402 closes and shunts the kickback noise to ground. However, the reset switch 402 may also have an undesired effect of forcing the input terminal 102 to ground between each sampling instant, limiting the tracking capabilities of the circuit 100, because the input terminal 102 must charge from ground back to the input signal potential. In addition, the reset switch 402 may increase an amount of active circuitry required by the circuit 100 and may occupy significant area in the circuit 100.

In another approach, an open-circuit quarter wavelength stub may be used to reduce kickback noise (e.g., partially or completely). This is possible due to certain characteristics of the frequency of the kickback noise oscillations. The frequency of the kickback noise oscillation is dependent on the edge rate of the control signal and the L-C properties of a transmission line. Therefore for a given switch network, there will be a measurable set of kickback noise frequencies that will occur regardless of the frequencies of the input signal and the sampling rate. The frequencies are related to the control signal and will be much greater than the frequency of the input signal.

Figure 5:
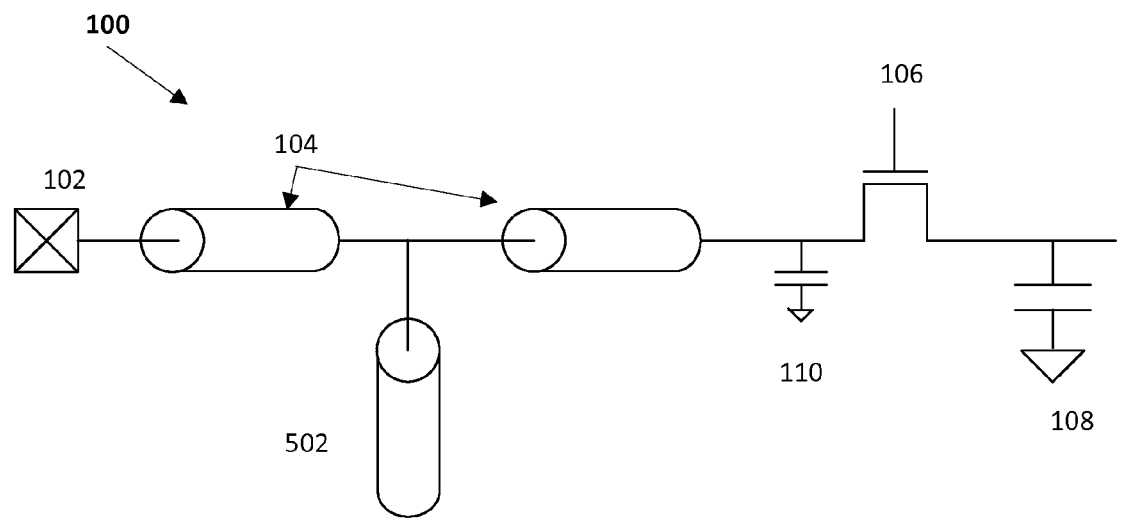
FIG. 5 shows a circuit for a switch network having a quarter-wavelength stub.

FIG. 5 illustrates a circuit 100 for a switch network (e.g., a switched capacitor network). The circuit 100 includes an input terminal 102, a transmission line 104, a sampling switch 106 coupled to the input terminal 102 through the transmission line 104, and a sampling capacitor 108. The parasitic elements of the circuit 100 are represented by item 110. The circuit 100 of FIG. 5 is the same as the circuit 100 of FIG. 1, except that the circuit 100 of FIG. 5 also includes an open-circuit quarter wavelength stub 502 that is coupled to the transmission line 104 on one end of the stub 502 and is an open circuit on the other end. As shown in the figure, the stub 502 is coupled to a location on the transmission line 104 that is between the input terminal 102 and the sampling switch 106.

In some embodiments, the quarter-wavelength stub 502 may be a section of transmission line with a length of one quarter of the wavelength of a fundamental frequency. In other embodiments, the quarter-wavelength stub 502 may be a tear drop type stub. The quarter wavelength stub 502 has one end that is an open circuit, making it an open-circuit quarter wavelength stub. An open-circuit stub may function as a band-stop filter. Altering the length of the open-circuit stub 502 changes the center frequency of the filtered band, which corresponds to a frequency where one-quarter of the wavelength is equal to the length of the stub. In the illustrated embodiments, the open-circuit quarter wavelength stub 502 is coupled to the transmission line 104, with one end shorted to the transmission line, and the other end that is an open circuit. In some embodiments, the open-circuit quarter wavelength stub 502 may be a passive component (e.g., a wire) that is coupled to the transmission line 104.

In some embodiments, a frequency of the kickback noise oscillations may be determined. This is possible because each switched capacitor network will have a set of kickback noise oscillation frequencies that is dependent on the edge rate of the switch control signal and the circuit elements present in the network, and is independent of the input signal frequency and sampling frequency. The determination of the frequency of the kickback noise oscillations may be done through a variety of methods, including but not limited to SPICE simulation or measuring the oscillations in a laboratory environment.

Once the frequency of the kickback noise oscillations is known, then the open-circuit quarter wavelength stub 502 may be configured to act as a notch filter for that frequency by matching the quarter-wavelength of the undesired frequency with the length of the stub 502. The configuring of the stub 502 may involve determining a length for the stub 502 (e.g., through calculation), designing the stub 502 to have the determined length, and/or constructing the stub 502 to have the determined length. The configuring of the stub 502 may also involve determining a cross sectional shape and/or dimension for the stub 502. Thus, in different embodiments, the stub 502 may have different lengths and/or different cross sectional shapes (e.g., circular shape, rectangular shape, elliptical shape, an asymmetrical shape, an irregular shape, etc.). Because the frequencies at which kickback noise oscillations occur are much higher than the frequencies of input signals, the quarter wavelength stub 502 will be transparent to the input signal. This allows the quarter wavelength stub 502 to filter the kickback noise oscillations when the sampling switch 106 is open, but not degrade the input signal when the sampling switch 106 is closed. In some embodiments, the quarter wavelength stub 502 has a fixed configuration that is based on the design of the circuit 100. In such cases, for different switch networks, different respective quarter wavelength stubs may be configured to match the frequencies of the kickback noises associated with the respective circuits.

During operation, when the sampling switch 106 is closed, the input signal from the input terminal 102 will charge the sampling capacitor 108 like that shown in FIG. 2-1. Parasitic capacitance 110 will also be charged during this time. Because the open-circuit quarter wavelength stub 502 is transparent to the input signal, this phase of the operation is unaffected.

When the sampling switch 106 is opened, the charge on sampling capacitor 108 is stored and preserved. As in FIG. 2-2, the charge stored by parasitic capacitance 110 will be discharged through transmission line 104. However, because the open-circuit quarter wavelength stub 502 is configured as a band-stop filter centered around the frequency associated with the kickback noise oscillation, the oscillation will be attenuated by the filter and removed from the system. When the sampling switch 106 closes again for the next sampling instant, the sampling will not suffer from persisted kickback noise oscillations of that frequency.

Using the quarter-wavelength stub 502 in this way offers a number of advantages. Unlike the method of using a serial damping resistor, the quarter wavelength stub 502 is transparent to the input signal, and thus does not degrade the input signal the way a resistor would. Unlike the reset switch, the quarter wavelength stub 502 does not force the input network to ground between each sample. In addition, the quarter wavelength stub 502 reduces circuit complexity as it does not require any active devices such as an additional MOSFET component. Also, because the kickback noise oscillations occur at much higher frequencies than the input signal frequency, the quarter wavelength stub 502 will typically be very short in comparison to the length of the transmission line 104, offering a potential area savings as compared to a damping resistor or reset switch.

Figure 6:
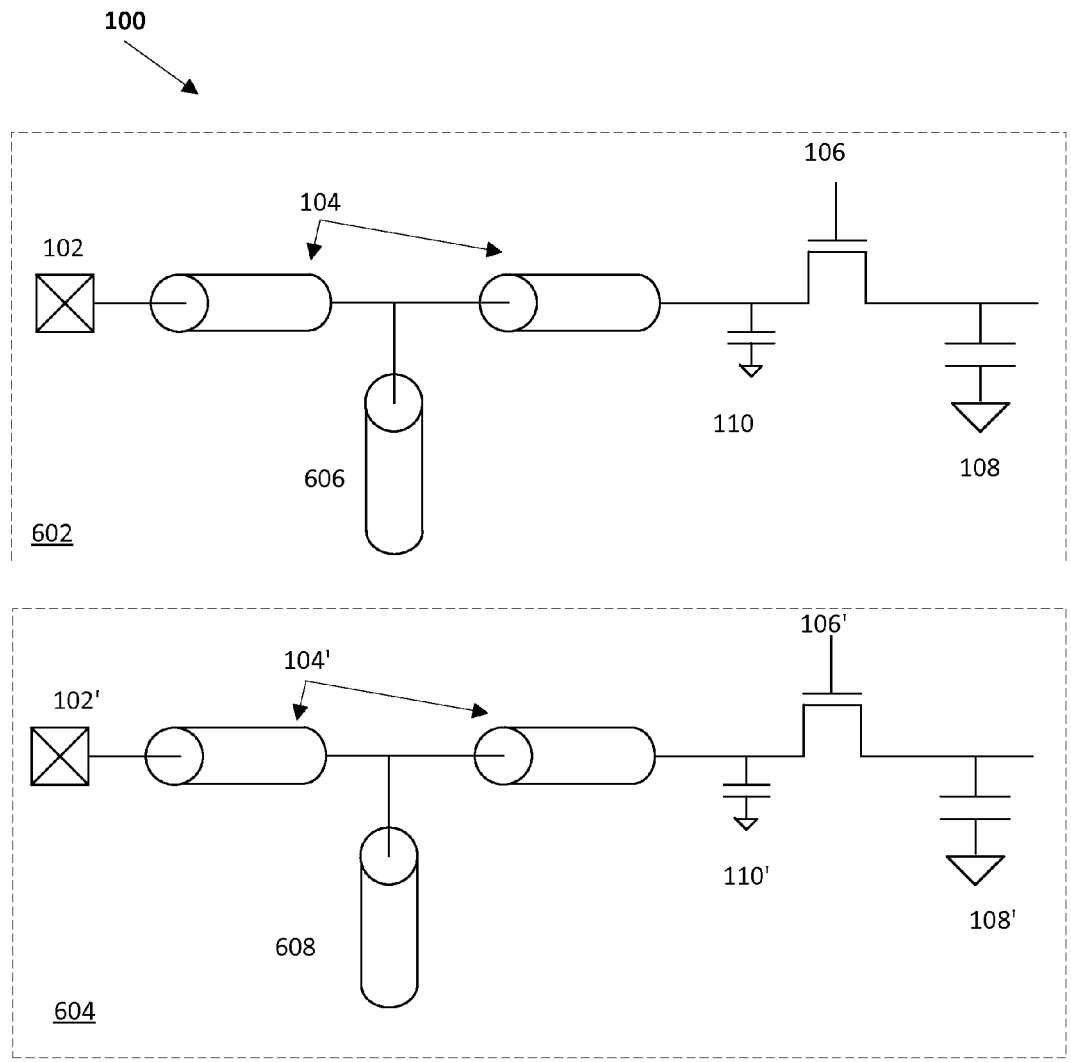
FIG. 6 shows a differential circuit.

In the above embodiments, the circuit 100 has been illustrated as having a single-armed configuration. In other embodiments, the circuit 100 may have other configurations. FIG. 6 shows a differential circuit 100 for a switch network (e.g., a switched capacitor network) that does not have a single-armed configuration. The differential circuit 100 has two input circuit arms—i.e., a first circuit arm 602 and a second circuit arm 604. The first circuit arm 602 includes an input terminal 102, connected to a sampling network comprising a sampling switch 106 and a sampling capacitor 108 through a transmission line 104. Similarly, the second circuit arm 604 includes an input terminal 102', connected to a sampling network comprising a sampling switch 106' and a sampling capacitor 108' through a transmission line 104'. The first and second arms 602, 604 also include respective parasitic capacitances 110, 110' associated with the respective circuit elements. In the first arm 602, an open-circuit quarter-wavelength stub 606 is coupled to the transmission line 104, and in the second arm 604, an open-circuit quarter-wavelength stub 608 is coupled to the transmission line 104'. The quarter wavelength stub 606 has one end that is an open circuit, making it an open-circuit quarter wavelength stub. The same is true for the quarter wavelength stub 608. The quarter-wavelength stub 606 is configured (e.g., by having a certain length) to match a measured kickback noise frequency in the first arm 602 of the circuit 100, and the quarter-wavelength stub 608 is configured (e.g., by having a certain length) to match a measured kickback noise frequency in the second arm 604 of the circuit 100. In some cases, the arms 602, 604 may be the same or may have similar properties. Accordingly, the stubs 606, 608 may have similar lengths (e.g., same length, or lengths that do not differ by more than 20%) to filter the same frequency of kickback noise.

The differential circuit 100 of FIG. 6 is beneficial for reducing the effects of external interference by sending two complementary signals through two arms 602, 604. In the differential circuit 100 of FIG. 6, components measuring the voltages of the sampling capacitors take the difference of the measured values on the two arms, instead of measuring the difference between a single voltage and ground as in a single-armed system. Because external interference such as electromagnetic noise will tend to affect both arms 602, 604 similarly, the interference which will cancel out when the difference is taken. It should be noted that while the differential circuit 100 will attenuate noise common to both signals, the kickback noise may or may not be identical in both arms 602, 604. For example, one arm may be at a different voltage to its compliment at the sampling instant owing to the differential nature of the system. Therefore, the charge stored and released by elements 110 and 110' may be different. In such cases, the circuit 100 or a system that includes the circuit 100 (e.g., a differential receiver) may be configured to determine and record the net difference. With the stubs 606, 608 removing the noise on both arms 602, 604, any remaining common mode noise (e.g., from external environment) will be removed in the differential approach.

Figure 7:
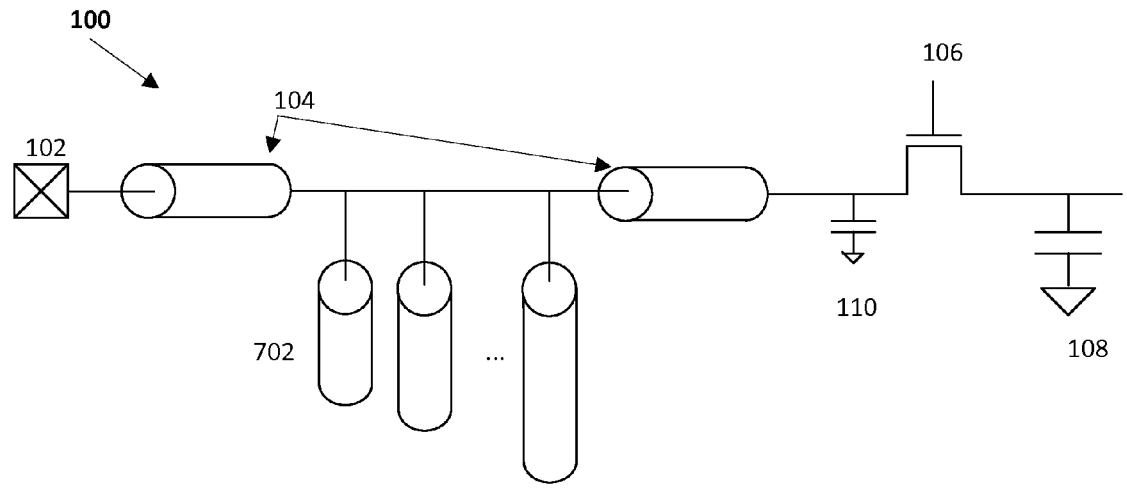
FIG. 7 shows an embodiment that uses multiple quarter-wavelength stubs to filter multiple frequency components of a kickback noise.

In some embodiments, it is possible for the kickback noise of a switch network to contain multiple frequency components. FIG. 7 shows a circuit 100 for a switch network (e.g., a switched capacitor network), with input terminal 102 connected to a sampling network comprising a sampling switch 106 and a sampling capacitor 108 through a transmission line 104. The circuit 100 includes parasitic capacitance 110. To filter out the multiple frequency components of kickback noise associated with the parasitic capacitance, multiple open-circuit quarter-wavelength stubs 702 may be used. Each of the stubs 702 is of a different length configured to filter a different frequency component that is present within the kickback noise. When the sampling switch 106 is closed, sampling capacitor 108 and parasitic capacitance 110 are charged. When sampling switch 106 is opened, each of the different length open-circuit quarter wavelength stubs 702 will act as a notch filter for a respective different frequency component of the kickback noise.

In further embodiments, it is possible to implement a set of multiple open-circuit quarter-wavelength stubs (like the stubs 702 in FIG. 7) in each one of the multiple-arms of a differential circuit (like the arms 602, 604 of the circuit 100 of FIG. 6). For example, in the differential circuit 100 of FIG. 6, the stub 606 in the first arm 602 may be replaced with a set of multiple open-circuit quarter-wavelength stubs (like the set of stubs 702 shown in FIG. 7), and the stub 608 in the second arm 604 may be replaced with a set of multiple open-circuit quarter-wavelength stubs (like the set of stubs 702 shown in FIG. 7). The length of each of the stubs in the arm 602/604 is configured to filter a different component of kickback noise frequency on that arm. Such configuration allows filtering of kickback noise containing multiple frequency components.

Figure 8:
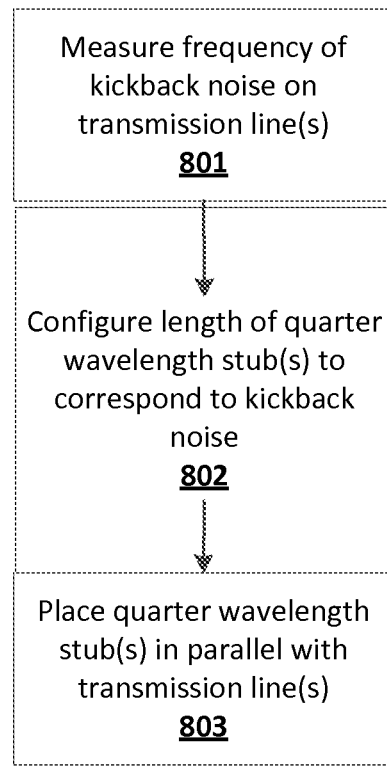
FIG. 8 illustrates a method of reducing kickback noise using a quarter-wavelength stub.

FIG. 8 depicts a method for reducing kickback noise in a circuit that involves using an open-circuit quarter-wavelength stub. The method begins at 801, where a set of frequencies associated with a kickback noise of an input circuit on a transmission line is measured. This is possible because each switched capacitor network will have a set of kickback noise oscillation frequencies that is dependent on the switch control signal and the circuit elements present in the network. The measurements can be done through a variety of methods, including but not limited to SPICE simulation or measuring the oscillations in a laboratory environment.

Next, in 802, the kickback noise frequency determined from item 801 are used to configure the length of one or more open-circuit quarter-wavelength stubs so that the open-circuit quarter-wavelength stub(s) corresponds to the frequency (or frequencies) of the kickback noise. In some embodiments, the open-circuit quarter-wavelength stub(s) may be the stub 502 shown in FIG. 5, the stubs 606, 608 shown in FIG. 6 if the circuit is a differential circuit, or the stubs 702 in FIG. 7 if kickback noise contains multiple frequency components.

Returning to FIG. 8, next, in 803, the open-circuit quarter-wavelength stub(s) is coupled to the transmission line of the switched capacitor network, like that shown in the embodiments of FIGS. 5-7. In some embodiments, the coupling of the open-circuit quarter-wavelength stub(s) to the transmission line (e.g., transmission line 104) may be performed in a design process. In such cases, the coupling may be performed using software for circuit design. In other embodiments, the coupling of the open-circuit quarter-wavelength stub(s) to the transmission line (e.g., transmission line 104) may be performed during a manufacturing process. For example, the stub(s) and the transmission line may be formed, and the stub(s) may then be connected to the transmission line. Alternatively, the stub(s) and the transmission line may be formed together so that the stub(s) extends from the transmission line, thereby coupling the stub(s) to the transmission line.

Although particular embodiments have been shown and described, it will be understood that they are not intended to limit the claimed invention, and it will be clear to those skilled in the art that various changes and modifications may be made without departing from the scope of the claimed invention. The specification and drawings are, accordingly, to be regarded in an illustrative rather than restrictive sense. The claimed invention is intended to cover alternatives, modifications, and equivalents.

The invention claimed is:

1. A circuit, comprising:
   a first input terminal;
   a first transmission line;
   a first sampling switch coupled to the first input terminal through the first transmission line;
   a first sampling capacitor coupled to the sampling switch; and
   a first open-circuit quarter wavelength stub coupled to the first transmission line, the first open-circuit quarter wavelength stub configured to reduce kickback noise on the first transmission line, wherein a length of the first open-circuit quarter wavelength stub is tuned to a first frequency associated with the kickback noise on the first transmission line.

2. The circuit of claim 1, wherein the first open-circuit quarter wavelength stub is configured to filter the first frequency associated with the kickback noise on the first transmission line.

3. The circuit of claim 1, wherein the first open-circuit quarter wavelength stub is transparent to an input signal from the first input terminal.

4. The circuit of claim 1, further comprising one or more additional open-circuit quarter wavelength stubs coupled to the first transmission line.

5. The circuit of claim 4, wherein a length of each of the one or more additional open-circuit quarter wavelength stubs is tuned to a respective frequency associated with the kickback noise on the first transmission line.

6. The circuit in claim 1, wherein the circuit further comprises:
   a second input terminal;
   a second transmission line;
   a second sampling switch coupled to the second input terminal through the second transmission line;
   a second sampling capacitor coupled to the second sampling switch; and
   a second open-circuit quarter wavelength stub coupled to the second transmission line.

7. The circuit in claim 6, wherein the first and second input terminals, the first and second transmission lines, the first and second sampling switches, and the first and second sampling capacitors are parts of a differential circuit.

8. The circuit in claim 6, wherein:
   a length of the second open-circuit quarter wavelength stub is tuned to a second frequency associated with kickback noise on the second transmission line.

9. The circuit in claim 6, wherein the first and second open-circuit quarter wavelength stubs have similar lengths.

10. The circuit in claim 6, further comprising:
    a first set of one or more additional open-circuit quarter wavelength stubs coupled to the first transmission line; and
    a second set of one or more additional open-circuit quarter wavelength stubs coupled to the second transmission line.

11. The circuit in claim 10, wherein:
    a length of each of the one or more additional open-circuit quarter wavelength stubs in the first set is tuned to a respective frequency associated with the kickback noise on the first transmission line; and
    a length of each of the one or more additional open-circuit quarter wavelength stubs in the second set is tuned to a respective frequency associated with kickback noise on the second transmission line.

12. A circuit, comprising:
    a first input terminal;
    a first transmission line;
    a first sampling switch coupled to the first input terminal through the first transmission line, wherein the sampling switch comprises an NMOS gate;
    a first sampling capacitor coupled to the sampling switch; and
    a first open-circuit quarter wavelength stub coupled to the first transmission line, the first open-circuit quarter wavelength stub configured to reduce kickback noise on the first transmission line.

13. A method for reducing kickback noise in a circuit, comprising:
    determining a frequency associated with a kickback noise on a first transmission line of the circuit, the circuit having an input terminal coupled to the first transmission line;
    configuring a length of an open-circuit quarter wavelength stub to correspond to the determined frequency; and
    coupling the open-circuit quarter wavelength stub to the first transmission line to filter the frequency associated with the kickback noise, wherein the kickback noise is resulted from opening a sampling switch in the circuit.

14. The method of claim 13, wherein the open-circuit quarter wavelength stub is transparent to an input signal from the input terminal.

15. The method of claim 13, further comprising determining an additional frequency associated with the kickback noise on the first transmission line.

16. The method of claim 15, further comprising:
    configuring a length of an additional quarter wavelength stub to correspond to the additional frequency associated with the kickback noise on the first transmission line; and
    coupling the additional open-circuit quarter wavelength stub to the first transmission line to filter the additional frequency associated with the kickback noise on the first transmission line.

17. The method of claim 13, further comprising:

determining a frequency associated with a kickback noise on a second transmission line of the circuit;

configuring a length of a first additional open-circuit quarter wavelength stub to correspond to the determined frequency associated with the kickback noise on the second transmission line; and coupling the first additional open-circuit quarter wavelength stub to the second transmission line to filter the frequency associated with the kickback noise on the second transmission line.

18. The method of claim 17, further comprising:

determining an additional frequency associated with the kickback noise on the first transmission line;

configuring a length of a second additional open-circuit quarter wavelength stub to correspond with the additional frequency associated with the kickback noise on the first transmission line; and coupling the second additional open-circuit quarter wavelength stub to the first transmission line to filter the additional frequency associated with the kickback noise on the first transmission line.

\* \* \* \* \*